(12) United States Patent
Uchino et al.

(10) Patent No.: US 7,924,080 B2
(45) Date of Patent: Apr. 12, 2011

(54) LEVEL SHIFTER CIRCUIT

(75) Inventors: Yukinori Uchino, Kanagawa (JP); Nobuaki Otsuka, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/603,811

(22) Filed: Oct. 22, 2009

(65) Prior Publication Data

US 2010/0201426 A1    Aug. 12, 2010

(30) Foreign Application Priority Data

Feb. 10, 2009    (JP) ................. 2009-028902

(51) Int. Cl.
*H03L 5/00*    (2006.01)
(52) U.S. Cl. ............... 327/333; 326/63; 326/80
(58) Field of Classification Search .......... 326/62–63, 326/80–81; 226/62–63, 80–81; 327/306, 327/333
See application file for complete search history.

(56) References Cited

U.S. PATENT DOCUMENTS

| 6,940,317 B2 * | 9/2005 | Suga ................ 327/65 |
| 7,414,453 B2 * | 8/2008 | Tachibana et al. ...... 327/333 |
| 7,511,553 B2 * | 3/2009 | Nuebling ............. 327/333 |

FOREIGN PATENT DOCUMENTS

| JP | 2000-174610 | 6/2000 |
| JP | 2000-286694 | 10/2000 |
| JP | 2006-129481 | 5/2006 |
| JP | 2006-135712 | 5/2006 |
| JP | 2007-201704 | 8/2007 |
| JP | 2008-283545 | 11/2008 |

* cited by examiner

*Primary Examiner* — Dinh T. Le
(74) *Attorney, Agent, or Firm* — Turocy & Watson, LLP

(57) ABSTRACT

A level shifter circuit converts a signal generated by an internal circuit which operates with a first power supply, into a signal by a second power supply having voltage higher than that of the first power supply. The voltages at substrate terminals of two NMOS transistors, to which complementary two signals by the first power supply are input, is boosted to voltage higher than circuit ground potential in a period in which a voltage level of one of the two input signals and a voltage level of an output signal by the second power supply do not coincide with each other.

16 Claims, 3 Drawing Sheets

LEVEL SHIFTER CIRCUIT

CROSS-REFERENCE TO RELATED APPLICATIONS

This application is based upon and claims the benefit of priority from the prior Japanese Patent Application No. 2009-028902, filed on Feb. 10, 2009; the entire contents of which are incorporated herein by reference.

BACKGROUND OF THE INVENTION

1. Field of the Invention

The present invention relates to a level shifter circuit.

2. Description of the Related Art

A large-scale semiconductor integrated circuit (LSI) that operates at voltage lower than that of an external circuit is supplied with a low-voltage power supply VDD1 for an internal circuit and a high-voltage power supply VDD2 for interface with the external circuit. A level shifter circuit that converts (boosts) a voltage level is provided in an interface circuit that outputs a signal generated by the internal circuit, which operates with the low-voltage power supply VDD1, to the external circuit, which operates with the high-voltage power supply VDD2.

In the level shifter circuit, in general, two series circuits of PMOS transistors and NMOS transistors are provided in parallel between the high-voltage power supply VDD2 and a circuit ground GND (hereinafter, "GND"). With the two NMOS transistors on the GND side set as a differential pair, two signals having a complementary relation by the low-voltage power supply VDD1 are respectively applied to gates of the NMOS transistors. Between the two PMOS transistors on the power supply VDD2 side, a gate of one PMOS transistor is connected to a drain of the other PMOS transistor and a drain of one PMOS transistor is connected to a gate of the other PMOS transistor. A signal by the power supply VDD2 corresponding to a signal by the power supply VDD1 input to one of the differential pair is output from a drain connecting end of one of the series circuits (see, for example, JP-A 2000-174610 (KOKAI) (FIG. 13)).

The level shifter circuit has a characteristic that, when the voltage of the power supply VDD1 drops and signal amplitude (a voltage level) of an input signal falls, the ability of the two NMOS transistors, which form the differential pair, for driving the two PMOS transistor falls and a propagation delay between an input and an output increases and, when the signal amplitude further falls to near a threshold value, propagation is exponentially delayed. This delay characteristic can be improved if threshold voltage of the two NMOS transistors is reduced. However, this causes an increase in a leak current. An increase in process steps for reducing the threshold voltage causes an increase in manufacturing cost.

In an LSI in recent years, power supply voltage (VDD1) of an internal circuit is steadily reduced according to requests for refining and lower power consumption. On the other hand, interface voltage (VDD2) with the outside of the LSI is not reduced at all because, for example, the interface voltage is decided by a standard and the like. Therefore, a potential difference between the power supply voltage (VDD1) of the internal circuit and the interface voltage (VDD2) with the outside of the LSI increases as the generation of the LSI descends. The problem of deterioration in the delay characteristic tends to become more serious.

SUMMARY OF THE INVENTION

According to one aspect of the present invention, in a level shifter circuit, gates of two NMOS transistors, sources of which are connected to a circuit ground, are input terminals to which two signals having a complementary relation generated by an internal circuit, which operates with a first power supply, are respectively input, a gate of one of two PMOS transistors, sources of which are connected to a second power supply having voltage higher than that of the first power supply, and a drain of the other of the two PMOS transistors are connected to each other and a drain of one of the two PMOS transistors and a gate of the other of the two PMOS transistors are connected to each other, and one of drain connecting ends of the two NMOS transistors and the two PMOS transistors is an output terminal for outputting a signal by the second power supply corresponding to a signal by the first power supply input to one of the two input terminals.

The level shifter circuit includes a comparator that operates with the first power supply and determines coincidence and non-coincidence of a voltage level of an input signal to one of the two input terminals and a voltage level of an output signal from the output terminal; and a substrate bias circuit that operates with the first power supply or the second power supply and boosts voltages of substrate terminals of the two NMOS transistors to voltage higher than circuit ground potential in a period in which the comparator determines that the voltage levels do not coincide with each other.

DETAILED DESCRIPTION OF THE INVENTION

Exemplary embodiments of the present invention are explained in detail below with reference to the accompanying drawings. The present invention is not limited by the embodiments.

Figure 1:
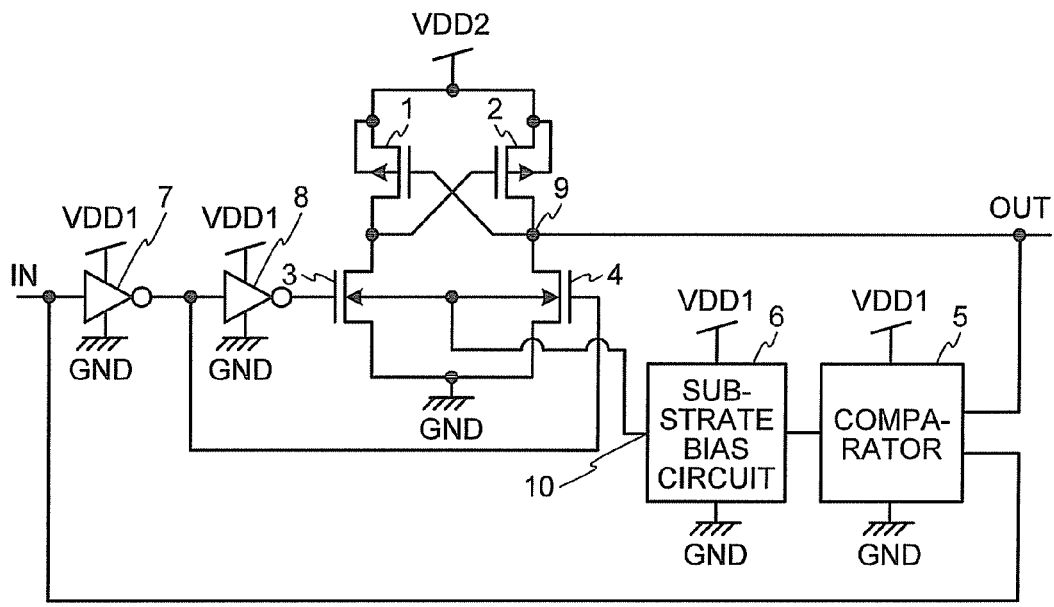
FIG. 1 is a circuit diagram of a configuration of a level shifter circuit according to a first embodiment of the present invention.

FIG. 1 is a circuit diagram of a configuration of a level shifter circuit according to a first embodiment of the present invention. In FIG. 1, a power supply VDD1 is a power supply for an internal circuit. A power supply VDD2 is a power supply for interface with an external circuit. A relation between levels of voltages of the power supplies is VDD1<VDD2.

First, to facilitate understanding of the present invention, a configuration of a level shifter circuit in the related art is explained with reference to FIG. 1. In FIG. 1, in the level shifter circuit in the related art, drains of two PMOS transistors 1 and 2, sources of which are connected to the high-voltage power supply VDD2, and drains of two NMOS transistors 3 and 4, sources of which are connected to a GND, are connected to each other. Between the two PMOS transistors 1 and 2, a gate of one PMOS transistor is connected to a drain of the other PMOS transistor and a drain of one PMOS transistor is connected to a gate of the other PMOS transistor. In the level shifter circuit in the related art, as shown in FIG. 1, substrate terminals of the two PMOS transistors 1 and 2 are connected to the power supply VDD2 together with the sources. However, substrate terminals of the two NMOS transistors 3 and 4 are connected to the GND together with the sources unlike those shown in FIG. 1.

In this configuration, in the two NMOS transistors 3 and 4 on the GND side as a differential pair, gates form differential input terminals. Two signals having a complementary relation are input to the input terminals. Two drain connecting ends are differential latch output ends. One of the drain connecting ends is used as an output end for outputting a signal by the power supply VDD2 corresponding to a signal by the power supply VDD1 input to one of the differential pair.

In the example shown in FIG. 1, two signals having a complementary relation generated by inverter circuits 7 and 8 in series two stages, which are present on an output side of the internal circuit that operates with the low-voltage power supply VDD1, are respectively applied to the gates of the two NMOS transistors 3 and 4. Specifically, an input signal IN from the internal circuit is logically inverted by the inverter circuit 7 and applied to the gate of the NMOS transistor 4. The input signal IN is inverted back to the original logic by the next inverter circuit 8 and applied to the gate of the NMOS transistor 3.

Therefore, in the example shown in FIG. 1, the drain connecting end of the PMOS transistor 2 and the NMOS transistor 4 of the two drain connecting ends is an output end 9. The input signal IN at the voltage level by the power supply VDD1 is converted (boosted) into an output signal OUT at the voltage level by the power supply voltage VDD2 and output to the output end 9.

In the level shifter circuit according to the first embodiment, a comparator 5 and a substrate bias circuit 6 that operate with the low-voltage power supply VDD1 are provided in addition to the configuration of the level sifter circuit in the related art. Further, in the level shifter circuit according to the first embodiment, the substrate terminals of the two NMOS transistors 3 and 4 on the GND side are separated from the GND as shown in FIG. 1 and connected to an output terminal 10 of the added substrate bias circuit 6.

The input signal IN to the inverter circuit 7 that operates with the low-voltage power supply VDD1 and the output signal OUT by the high-voltage power supply VDD2 from the output terminal 9 are input to the comparator 5. The comparator 5 determines coincidence and non-coincidence of the voltage level of the input signal IN to the inverter circuit 7, i.e., a voltage level of gate input of the NMOS transistor 3 and the voltage level of the output signal OUT from the output terminal 9. The comparator 5 outputs determination signals at binary levels respectively indicating periods of coincidence and non-coincidence to the added substrate bias circuit 6.

The comparator 5 performs comparison and determination operation based on the voltage of the power supply VDD1. Therefore, when the input signal IN rises from the GND level to the voltage level of the power supply VDD1 and the output signal OUT rises from the GND level to the voltage level of the power supply VDD2, the voltage level of the output signal OUT and the voltage level of the power supply VDD1 are determined as not coinciding with each other until the former rises from the GND level and exceeds the latter. The voltage level of the output signal OUT and the voltage level of the power supply VDD1 are determined as coinciding with each other when the former exceeds the latter. When the input signal IN falls from the voltage level of the power supply VDD1 to the GND level and the output signal OUT falls from the voltage level of the power supply VDD2 to the GND level, the voltage level of the output signal OUT and the voltage level of the power supply VDD1 are determined as not coinciding with each other until the former drops and falls below the latter. The voltage level of the output signal OUT and the voltage level of the power supply VDD1 are determined as coinciding with each other when the former falls below the latter.

In the example shown in FIG. 1, the substrate bias circuit 6 operates with the low-voltage power supply VDD1. Therefore, in a period in which the determination signal from the comparator 5 is at the signal level indicating non-coincidence, the substrate bias circuit 6 boosts the voltages at the substrate terminals of the two NMOS transistors 3 and 4 from the potential of the GND to the voltage between the potential of the GND and the voltage of the power supply VDD1. When the determination signal from the comparator 5 changes from the signal level indicating non-coincidence to the signal level indicating coincidence, the substrate bias circuit 6 performs operation for setting the voltages at the substrate terminals of the two NMOS transistors 3 and 4 to the potential of the GND.

Figure 2:
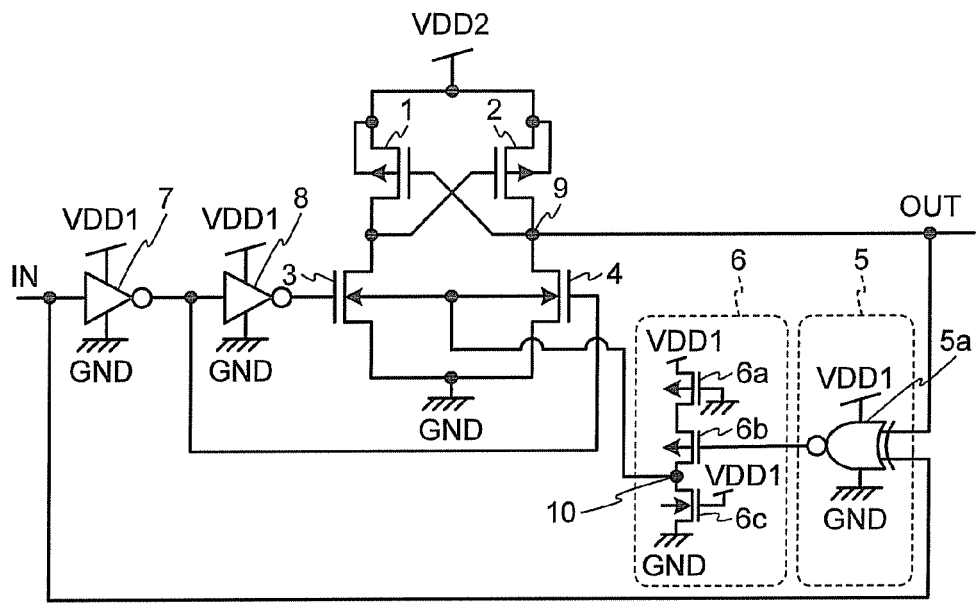
FIG. 2 is a circuit diagram of a specific configuration example of a comparator and a substrate bias circuit in the level shifter circuit shown in FIG. 1.

FIG. 2 is a circuit diagram of a specific configuration example of the comparator 5 and the substrate bias circuit 6 in the level shifter circuit shown in FIG. 1. As shown in FIG. 2, the comparator 5 can include, for example, an exclusive-nor circuit 5*a* that performs coincidence determination based on the voltage of the power supply VDD1. The exclusive-nor circuit 5*a* sets the output thereof to a high level when the signal level of the input signal IN and the signal level of the output signal OUT coincide with each other and sets the output to a low level when the signal level of the input signal IN and the signal level of the output signal OUT do not coincide with each other.

As shown in FIG. 2, in the substrate bias circuit 6, for example, two PMOS transistors 6*a* and 6*b* and one NMOS transistor 6*c* can be arranged in series between the power supply VDD1 and the GND. A gate of the PMOS transistor 6*a*, a source of which is connected to the power supply VDD1, is connected to the circuit ground GND. The PMOS transistor 6*a* is always on and is in a conduction state. A gate of the NMOS transistor 6*c*, a source of which is connected to the GND, is connected to the power supply VDD1. The NMOS transistor 6*c* is always on and is in a conduction state. A source of the PMOS transistor 6*b* is connected to a drain of the PMOS transistor 6*a*. A gate of the PMOS transistor 6*b* is connected to an output terminal of the exclusive-nor circuit 5*a*. A drain of the PMOS transistor 6*b* is connected to a drain of the NMOS transistor 6*c* and is connected to the substrate terminals of the NMOS transistors 3 and 4 as the output terminal 10.

In the configuration of the substrate bias circuit 6 shown in FIG. 2, when the output of the exclusive-nor circuit 5*a* is at the high level, the PMOS transistor 6*b* is off. Therefore, the substrate terminals of the NMOS transistors 3 and 4 connected to the output terminal 10 are connected to the GND through the NMOS transistor 6*c*. On the other hand, when the output of the exclusive-nor circuit 5*a* is at the low level, the PMOS transistor 6*b* is on. Therefore, a resistance voltage divider formed by a series circuit of the two PMOS transistors 6*a* and 6*b* and the NMOS transistor 6*c* generates voltage obtained by dividing the voltage of the power supply VDD1 into the voltage between the potential of the GND and the voltage of the power supply VDD1 and outputs the divided voltage to the output terminal 10. Consequently, the substrate terminals of the NMOS transistors 3 and 4 connected to the output terminal 10 are boosted to the voltage between the potential of the GND and the voltage of the power supply VDD1.

In this way, the PMOS transistor 6b operates as a switch for switching whether the voltages at the substrate terminals of the NMOS transistors 3 and 4 should be maintained at the potential of the GND or boosted from the potential of the GND to the potential between the potential of the GND and the voltage of the power supply VDD1.

In the above explanation, the substrate bias circuit 6 divides the voltage of the power supply VDD1. However, the substrate bias circuit 6 can also divide the voltage of the power supply VDD2 and boost the voltages at the substrate terminals of the two NMOS transistors 3 and 4 from the GND level to the voltage between the GND level and the voltage level of the power supply VDD2. Further, in the above explanation, the substrate bias circuit 6 includes the combination of the MOS transistors 6a and 6c including the MOS transistor 6b that operates as a switch. However, the substrate bias circuit 6 can also include a combinational circuit of a plurality of resistance elements including a MOS transistor that operates as a switch.

Figure 3A:
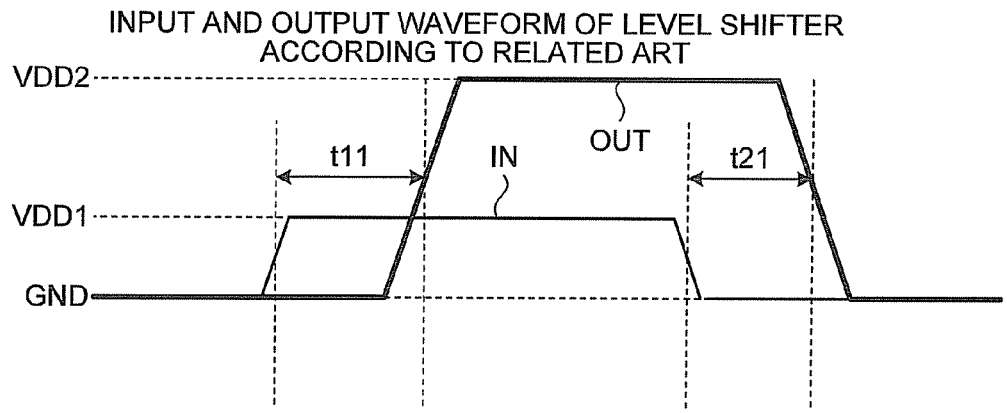
FIGS. 3A and 3B are output waveform charts of the operation of a level shifter circuit in the related art and the operation of the level shifter circuit shown in FIG. 1, respectively.
Figure 3B:
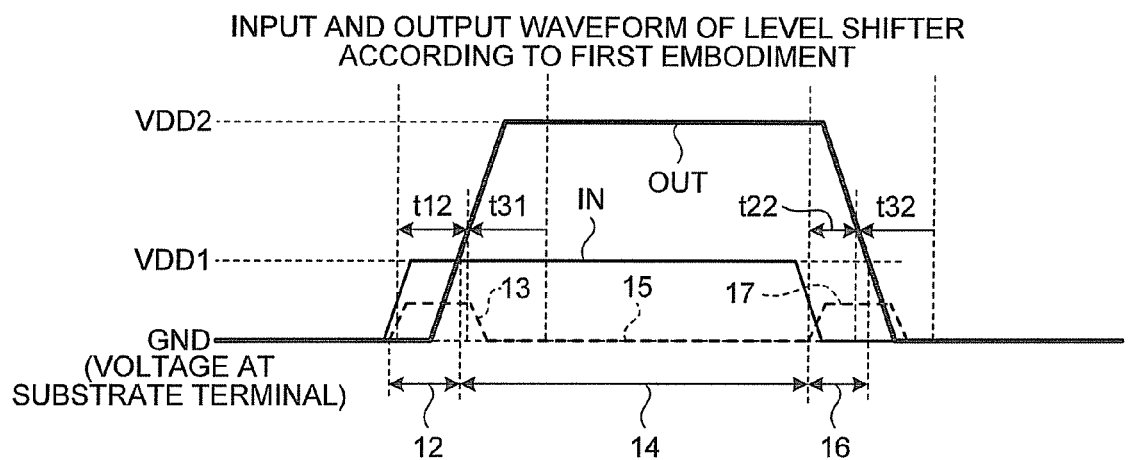

FIGS. 3A and 3B are input and output waveform charts of the operation of the level shifter circuit in the related art and the operation of the level shifter circuit shown in FIG. 1.

FIG. 3A is an input and output waveform chart of the level shifter circuit according to the related art. As explained above, in the level shifter circuit according to the related art, the comparator 5 and the substrate bias circuit 6 are not provided and the substrate terminals of the two NMOS transistors 3 and 4 are connected to the GND. Conversion operation in the level shifter circuit according to the related art is performed as explained below.

When the input signal IN rises from the GND level to the voltage level of the power supply VDD1, the NMOS transistor 3 is turned on at a point when gate input voltage exceeds threshold voltage. On the other hand, the NMOS transistor 4 is turned off at a point when the gate input voltage falls below the threshold voltage. When the NMOS transistor 3 is turned on and changes to a conduction state, because the gate potential of the PMOS transistor 2 is pulled down to the GND level, the PMOS transistor 2 is turned on and changes to the conduction state. The voltage level of the output terminal 9 rises from the GND level to the voltage level of the power supply VDD2. At the same time, because the gate potential of the PMOS transistor 1 rises to the voltage level of the power supply VDD2, the PMOS transistor 1 is turned off and changes to a non-conduction state. This state is maintained in a period in which the voltage level of the input signal IN is at the voltage level of the power supply VDD1. A signal at the voltage level of the power supply VDD2 is kept output from the output terminal 9.

When the input signal IN falls from the voltage level of the power supply VDD1 to the GND level, conversely to the above, the NMOS transistor 3 is turned off at a point when the gate input voltage falls below the threshold voltage. On the other hand, the NMOS transistor 4 is turned on at a point when the gate input voltage exceeds the threshold voltage. When the NMOS transistor 4 is turned on and changes to the conduction state, the voltage at the output terminal 9 falls from the voltage level of the power supply VDD2 to the GND level. At the same time, because the gate potential of the PMOS transistor 1 is pulled down to the GND level, the PMOS transistor 1 is turned on and changes to the conduction state. When the PMOS transistor 1 changes to the conduction state, because the gate potential of the PMOS transistor 2 rises to the voltage level of the power supply VDD2, the PMOS transistor 2 is turned off and changes to the non-conduction state. This state is maintained in a period in which the input signal IN is at the GND level. A signal at the GND level is kept output from the output terminal 9 in the same manner.

In FIG. 3A, a period from the point when the input signal IN rises from the GND level to the voltage level of the power supply VDD1 to the point when the output signal OUT rises from the GND level to the voltage level of the power supply VDD2, i.e., delay time, is defined as a period t11 from a point when the voltage level of the input signal IN reaches "(voltage of the power supply VDD1)/2" to a point when the voltage level of the output signal OUT reaches "(voltage of the power supply VDD2)/2". Similarly, a period t21 indicates, according to the definition, delay time from a point when the input signal IN falls from the voltage level of the power supply VDD1 to the GND level to a point when the output signal OUT falls from the voltage level of the power supply VDD2 to the GND level.

FIG. 3B is an input and output waveform chart of the level shifter circuit according to the first embodiment. Conversion operation in the level shifter circuit according to the first embodiment is performed as explained below. The conversion operation is explained with reference to FIG. 2 as well. It is assumed that the voltage of the power supply VDD1 for the internal circuit is the same as that of the circuit in the related art explained above with reference to FIG. 3A.

When the input signal IN rises from the GND level to the voltage level of the power supply VDD1, two input signals of the comparator 5 do not coincide with each other in a period t2 in which the voltage level of the output signal OUT rises and passes the voltage level of the power supply VDD1. Therefore, the exclusive-nor circuit 5a included in the comparator 5 sets the output thereof to the low level (the GND level). In a period in which the output of the exclusive-nor circuit 5a is at the low level, the PMOS transistor 6b in the substrate bias circuit 6 changes to an ON state. Predetermined voltage 13 between the GND level and the voltage of the power supply VDD1 is generated at the output terminal 10 of the substrate bias circuit 6. Consequently, the voltages at the substrate terminals of the two NMOS transistors 3 and 4 are boosted to the predetermined voltage 13.

When the voltages at the substrate terminals are boosted to the predetermined voltage 13, the threshold voltage of the two NMOS transistors 3 and 4 falls and a driving ability relative to the PMOS transistors 1 and 2 increases. Specifically, in this example, pull-down of the gate potential of the PMOS transistor 2 to the GND level is performed at high speed. A signal at the voltage level of the power supply VDD2 is output from the output terminal 9 more quickly than in the case of the circuit in the related art. The delay time t11 in the circuit in the related art changes to shorter delay time t12. In the level shifter circuit according to the first embodiment, delay time during rising is reduced from that of the circuit in the related art by a period t31, which is a difference between the delay time t11 and the delay time t12.

When the voltage level of the output signal OUT exceeds the voltage of the power supply VDD1, the two input signals of the comparator 5 coincide with each other. Therefore, in a period t4 in which the input signals coincide with each other, the exclusive-nor circuit 5a included in the comparator 5 sets the output thereof to the high level (the output level of the power supply VDD1). In a period in which the output of the exclusive-nor circuit 5a is at the high level, the PMOS transistor 6b in the substrate bias circuit 6 changes to an OFF state. The output terminal 10 of the substrate bias circuit 6 changes to the GND level. The voltages at the substrate terminals of the two NMOS transistors 3 and 4 are set to a GND level 15. This makes it possible to reduce generation of a leak current as much as possible.

When the input signal IN falls from the voltage level of the power supply VDD1 to the GND level, in a period 16 in which the voltage level of the output signal OUT drops and falls below the voltage level of the power supply VDD1, the two input signals of the comparator 5 do not coincide with each other. Therefore, the exclusive-nor circuit 5a included in the comparator 5 sets the output thereof to the low level (the GND level). In a period in which the output of the exclusive-nor circuit 5a is at the low level, the PMOS transistor 6b in the substrate bias circuit 6 changes to the turned-on state. Predetermined voltage 17 between the GND level and the voltage of the power supply VDD1 is generated at the output terminal 10 of the substrate bias circuit 6. Consequently, the voltages at the substrate terminals of the two NMOS transistors 3 and 4 are boosted to the predetermined voltage 17.

When the voltages of the substrate terminals are boosted to the predetermined voltage 17, the threshold voltage of the two NMOS transistors 3 and 4 falls and the driving ability relative to the PMOS transistors 1 and 2 increases. Specifically, in this example, pull-down of the gate potential of the PMOS transistor 1 to the GND level is performed at high speed. A signal at the GND level is output from the output terminal 9 more quickly than in the case of the circuit in the related art. The delay time t21 in the circuit in the related art changes to shorter delay time t22. In the level shifter circuit according to the first embodiment, delay time during falling is reduced from that of the circuit in the related art by a period t32, which is a difference between the delay time t21 and the delay time t22.

Figure 4:
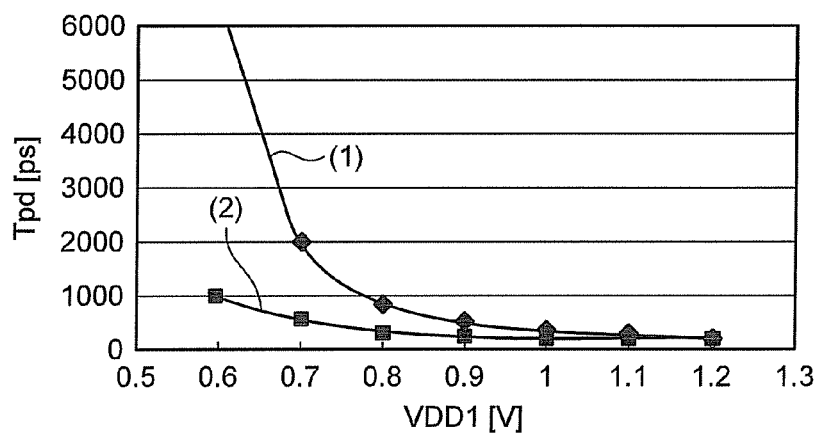
FIG. 4 is a characteristic chart of a delay characteristic in the level shifter circuit shown in FIG. 1 compared with that of the circuit in the related art.

FIG. 4 is a characteristic chart of a delay characteristic in the level shifter circuit shown in FIG. 1 compared with that in the circuit in the related art. In FIG. 4, the abscissa represents the voltage [V] of the power supply VDD1 for the internal circuit and the ordinate represents delay time Tpd [ps] in propagation of a signal from the input signal IN to the output signal OUT. In FIG. 4, a delay characteristic (1) in the circuit in the related art and a delay characteristic (2) in the level shifter circuit according to the first embodiment are shown. The delay characteristics are obtained by sequentially dropping the voltage of the power supply VDD1 for the internal circuit from 1.2 volts to 0.6 volt at an interval of 0.1 volt when the voltage of the power supply VDD2 for interface is 3.3 volts.

As shown in FIG. 4, the delay characteristic (1) in the circuit in the related art indicates that the delay time gently increases toward 1000 [ps] until the voltage of the power supply VDD1 falls to near 0.8 volt but, when the voltage of the power supply VDD1 falls to be equal to or lower than 0.8 volt, the delay time exponentially increases. On the other hand, the delay characteristic (2) in the level shifter circuit according to the first embodiment indicates that the delay time gently increases toward 1000 [ps] until the voltage of the power supply VDD1 passes 0.8 volt and falls to near 0.6 volts.

In this way, it is seen that, in the level shifter circuit according to the first embodiment, even when the voltage of the power supply VDD1 for the internal circuit falls, deterioration in delay is gentle and the delay characteristic is substantially improved compared with the circuit in the related art.

Therefore, according to the first embodiment, it is possible to provide a level shifter circuit that can flexibly cope with a shift of a LSI to low-voltage driving and enables an increase in speed.

Figure 5:
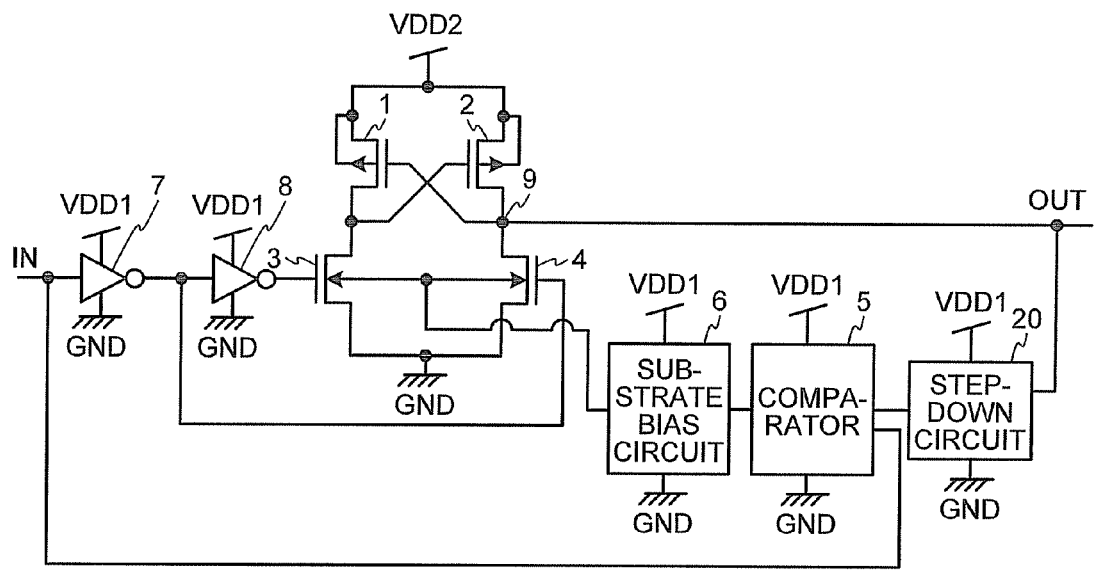
FIG. 5 is a circuit diagram of a configuration of a level shifter circuit according to a second embodiment of the present invention.
Figure 6:
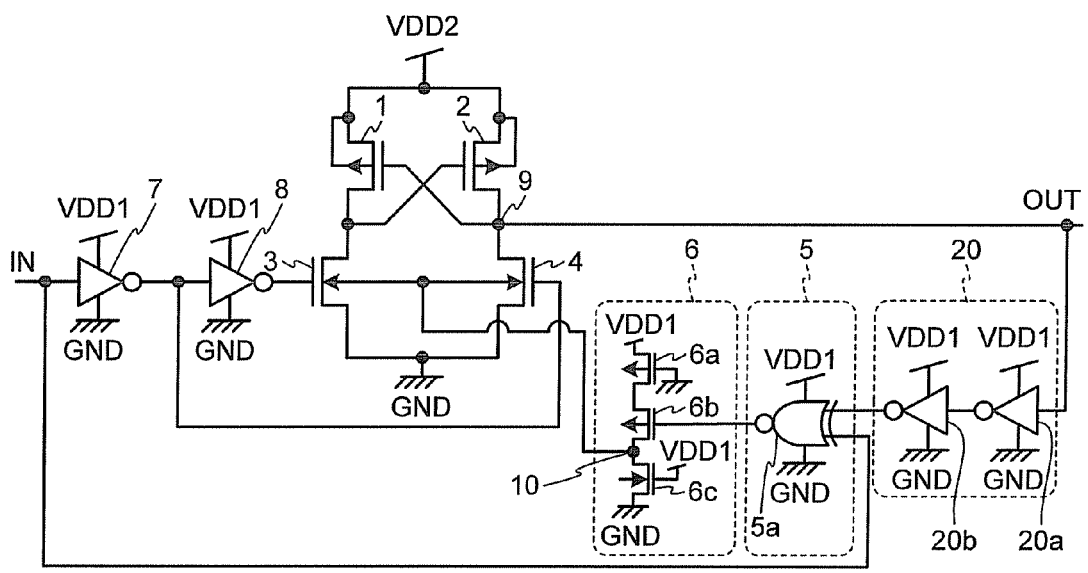
FIG. 6 is a circuit diagram of a specific configuration example of a comparator, a substrate bias circuit, and a step-down circuit in the level shifter circuit shown in FIG. 5.

FIG. 5 is a circuit diagram of a configuration of a level shifter circuit according to a second embodiment of the present invention. FIG. 6 is a circuit diagram of a specific configuration example of a comparator, a substrate bias circuit, and a step-down circuit in the level shifter circuit shown in FIG. 5. In FIGS. 5 and 6, components same as or equivalent to those shown in FIGS. 1 and 2 (the first embodiment) are denoted by the same reference numerals and signs. Components related to the second embodiment are mainly explained below.

As explained in the first embodiment, the comparator 5 operates with the low-voltage power supply VDD1 for the internal circuit. However, depending on a degree of a shift of an LSI to low-voltage driving, a potential difference between two input signals is considerably large. Then, the withstanding voltage of a MOS transistor included in the comparator 5 (in the example shown in FIG. 2, a MOS transistor included in the exclusive-nor circuit 5a) poses a problem.

Therefore, as shown in FIG. 5, in the level shifter circuit according to the second embodiment, a step-down circuit 20 that operates with the power supply VDD1 is interposed between the output terminal 9 and a corresponding input terminal of the comparator 5 in the configuration shown in FIG. 1 (the first embodiment).

For example, as shown in FIG. 6, the step-down circuit 20 can include inverter circuits 20a and 20b in series two stages that operate with the power supply VDD1. With this configuration, a signal at the voltage level of the power supply VDD2 from the output terminal 9 is logically inverted into a signal at the GND level by the inverter circuit 20a. The signal at the GND level is logically inverted into a signal at the voltage level of the power supply VDD1 by the next inverter circuit 20b and input to the comparator 5 (the exclusive-nor circuit 5a). Therefore, the problem of the withstanding voltage can be avoided.

Taking into account the problem of the withstanding voltage, a gate oxide film of a MOS transistor included in the step-down circuit 20 is formed thick in the same manner as the PMOS transistors 1 and 2 and the NMOS transistors 3 and 4. On the other hand, gate oxide films of MOS transistors included in the comparator 5 and the substrate bias circuit 6 are formed thin in the same manner as the MOS transistors included in the internal circuits such as the inverter circuits 7 and 8.

In this way, according to the second embodiment, it is possible to avoid the problem of the withstanding voltage with a simple configuration and more flexibly cope with a shift of a LSI to low-voltage driving.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A level shifter circuit in which gates of two NMOS transistors, sources of which are connected to a circuit ground, are input terminals to which two input signals having a complementary relation generated by an internal circuit, which operates with a first power supply, are respectively input, a gate of one of two PMOS transistors, sources of which are connected to a second power supply having voltage higher than that of the first power supply, and a drain of the other of the two PMOS transistors are connected to each other and a drain of one of the two PMOS transistors and a gate of the other of the two PMOS transistors are connected to each other, and one of drain connecting ends of the two NMOS transistors and the two PMOS transistors is an output terminal for outputting an output signal by the second power supply corresponding to a signal by the first power supply input to one of the two input terminals, the level shifter circuit comprising:

a comparator that operates with the first power supply and determines coincidence and non-coincidence of a voltage level of the input signal to one of the two input terminals and a voltage level of the output signal from the output terminal; and a substrate bias circuit that operates with the first power supply or the second power supply and boosts voltages of substrate terminals of the two NMOS transistors to voltage higher than circuit ground potential in a period in which the comparator determines that the voltage levels do not coincide with each other.

2. The level shifter circuit according to claim 1, wherein a step-down circuit that operates with the first power supply and converts a voltage level of the output signal by the second power supply output to the output terminal into a voltage level of the input signal by the first power supply is provided between the output terminal and a corresponding input terminal of the comparator.

3. The level shifter circuit according to claim 2, wherein MOS transistors included in the comparator and the substrate bias circuit and a MOS transistor included in the internal circuit have first gate oxide films, and a MOS transistor included in the step-down circuit, the two NMOS transistors, and the two PMOS transistors have second gate oxide films.

4. The level shifter circuit according to claim 1, wherein the substrate bias circuit includes a combinational circuit of a plurality of MOS transistors including a MOS transistor that operates as a switch, the combinational circuit being arranged between the first power supply or the second power supply and the circuit ground.

5. The level shifter circuit according to claim 2, wherein the substrate bias circuit includes a combinational circuit of a plurality of MOS transistors including a MOS transistor that operates as a switch, the combinational circuit being arranged between the first power supply or the second power supply and the circuit ground.

6. The level shifter circuit according to claim 1, wherein
the substrate bias circuit includes a first MOS transistor that is on in a period in which the comparator determines that the voltage levels do not coincide with each other and is off in a period in which the comparator determines that the voltage levels coincide with each other, a second MOS transistor that is provided between the first power supply or the second power supply and the first MOS transistor and is always on, and a third MOS transistor that is provided between the first MOS transistor and the circuit ground and is always on, and the substrate terminals of the two NMOS transistors are connected to a connection end of the first MOS transistor and the third MOS transistor.

7. The level shifter circuit according to claim 2, wherein
the substrate bias circuit includes a first MOS transistor that is on in a period in which the comparator determines that the voltage levels do not coincide with each other and is off in a period in which the comparator determines that the voltage levels coincide with each other, a second MOS transistor that is provided between the first power supply or the second power supply and the first MOS transistor and is always on, and a third MOS transistor that is provided between the first MOS transistor and the circuit ground and is always on, and the substrate terminals of the two NMOS transistors are connected to a connection end of the first MOS transistor and the third MOS transistor.

8. The level shifter circuit according to claim 1, wherein the substrate bias circuit includes a combinational circuit of a plurality of resistance elements including a MOS transistor that operates as a switch, the combinational circuit being arranged between the first power supply or the second power supply and the circuit ground.

9. The level shifter circuit according to claim 2, wherein the substrate bias circuit includes a combinational circuit of a plurality of resistance elements including a MOS transistor that operates as a switch, the combinational circuit being arranged between the first power supply or the second power supply and the circuit ground.

10. The level shifter circuit according to claim 1, wherein
the substrate bias circuit includes a MOS transistor that is on in a period in which the comparator determines that the voltage levels do not coincide with each other and is off in a period in which the comparator determines that the voltage levels coincide with each other, a first resistance element provided between the first power supply or the second power supply and the MOS transistor, and a second resistance element provided between the MOS transistor and the second resistance element, and the substrate terminals of the two NMOS transistors are connected to a connection end of the MOS transistor and the second resistance element.

11. The level shifter circuit according to claim 2, wherein
the substrate bias circuit includes a MOS transistor that is on in a period in which the comparator determines that the voltage levels do not coincide with each other and is off in a period in which the comparator determines that the voltage levels coincide with each other, a first resistance element provided between the first power supply or the second power supply and the MOS transistor, and a second resistance element provided between the MOS transistor and the second resistance element, and the substrate terminals of the two NMOS transistors are connected to a connection end of the MOS transistor and the second resistance element.

12. The level shifter circuit according to claim 1, wherein the comparator includes an exclusive inverting OR circuit.

13. The level shifter circuit according to claim 2, wherein the comparator includes an exclusive inverting OR circuit.

14. The level shifter circuit according to claim 1, wherein the comparator includes an exclusive non-inverting OR circuit.

15. The level shifter circuit according to claim 2, wherein the comparator includes an exclusive non-inverting OR circuit.

16. The level shifter circuit according to claim 2, wherein the step-down circuit includes inverter circuits in series even-number stages.

* * * * *